United States Patent [19]

Gradl et al.

[11] Patent Number: 5,003,451
[45] Date of Patent: Mar. 26, 1991

[54] SWITCHED DAMPER CIRCUIT FOR DC TO DC POWER CONVERTERS

[75] Inventors: David A. Gradl, Naperville, Ill.; Stephen M. Henning, Fleetwood, Pa.

[73] Assignee: AT&T Bell Laboratories, Murray Hill, N.J.

[21] Appl. No.: 454,489

[22] Filed: Dec. 21, 1989

[51] Int. Cl.$^5$ .......................................... H02M 3/335
[52] U.S. Cl. .......................................... 363/56; 363/21
[58] Field of Search .................. 363/20, 21, 56, 97, 363/131; 361/18

[56] References Cited

U.S. PATENT DOCUMENTS

| | | | |
|---|---|---|---|
| 4,063,306 | 12/1977 | Perkins et al. | 363/56 |
| 4,389,702 | 6/1983 | Clemente et al. | 363/56 |
| 4,402,039 | 8/1983 | Jirka | 363/21 |
| 4,499,532 | 2/1985 | Hudson et al. | 363/21 |
| 4,616,300 | 10/1986 | Santelmann, Jr. | 363/21 |
| 4,704,670 | 11/1987 | Gradl et al. | 363/21 |

OTHER PUBLICATIONS

*High-Frequency Power Supplies Theory & Design*, George Chryssis, pp. 11 through 24, 60 through 63, McGraw-Hill Book Company, 1984.

*Primary Examiner*—Peter S. Wong
*Attorney, Agent, or Firm*—S. W. McLellan

[57] ABSTRACT

A damper circuit for switching power supplies to improve the stability thereof with high efficiency. A resistor, having a value which critically damps the flyback transformer in the supply, is selectively coupled to the transformer by a switch when the switching transistor is disabled. The decoupling of the resistor when the switching transistor is on reduces power dissipation, compared to passive damping techniques, and allows integration of the damper onto the same IC as the control circuits of the supply. The damper increases the stability of the supply by absorbing excess energy not transferred to the load. The excess energy would instead be dissipated in the transistor and upsetting the control circuits of the supply, leading to instability of thereof. In addition, a clamp circuit is provided which keeps the switch from turning on due to high slew rate transients across the transformer from the turn-on of the switching transistor.

4 Claims, 3 Drawing Sheets

SWITCHED DAMPER CIRCUIT FOR DC TO DC POWER CONVERTERS

BACKGROUND OF THE INVENTION

1. Field of the Invention

This invention relates to switching power supplies in general and, more particularly, to switching power supplies utilizing inductive energy storage.

2. Description of the Prior Art

Typical switching power supplies have energy storage elements which, during one part of the switching cycle, have loaded therein energy which is later transferred to a load during a subsequent part of the cycle. Feedback is usually provided to regulate the output current or voltage from the supply to the load. Typical storage elements are inductors, such as a transformer. For purposes here, the switching cycle has two parts, the loading of the energy into the storage elements, called an "inhale" and the transfer of the energy from the storage element to the load, called an "exhale". If less than all the energy stored in the storage elements is transferred to the load, the remaining energy is dissipated prior to the beginning of the next inhale step. Most power supply designs go to great lengths to minimize the amount of excess energy. However, even the most efficient designs have excess energy remaining in the storage elements after an exhale. As will be discussed in more detail below, the dissipation of the remaining excess energy may cause excessive heating of components in the power supply as well as instability in the operation of the supply.

Although the elements and operation of a switching power supply are well known, a brief description is given herein. The typical switching power supply has a switching transistor, driven by a control circuit between cutoff and saturation, which loads the storage elements with energy from a power source. Controlling the amount of energy loaded into the storage element is determined by the length of time the transistor is conducting and the amount of current allowed into the storage elements thereby. This energy is approximately:

$$\tfrac{1}{2} \int_0^T i(t) L \, dt;$$

where L is the combined equivalent inductance of the storage elements, i(t) is the current into the storage elements as a function of time, and T is the time the switching transistor is saturated (conducting). It is understood that this inductance may vary as a function of the current. Typically, the current function is an exponential; no shaping thereof is provided beyond the nominal current inrush into an inductor. For purposes here, only the amount of time the transistor is conducting controls the energy loaded during the inhale; the frequency of the switching cycle and the power source voltage are assumed to be fixed.

The control circuits determine the amount of time the switching transistor is conducting by feeding back the output current and/or voltage presented to the load. This feedback regulates the voltage and/or current going to the load to a predetermined amount. In addition, the power from the supply may be limited when a given current is drawn therefrom. For example, the switching power supplies shown in U.S. Pat. Nos. 4,499,532 and 4,704,670, assigned to the same assignee as this invention, provide a constant output power for use in subscriber line circuits. Here, the feedback, in addition to that discussed above, includes turning off the switching transistor when the current in the storage elements during the inhale exceeds a predetermined amount.

The dissipation of excess energy typically occurs in the storage elements (due to non-ideal inductors therein) and in the switching transistor. Transients caused by the switching transistor conducting prior to the full dissipation of the excess energy in the storage elements causes the excess energy to be dissipated therein. The transients are also introduced into the feedback circuits, particularly those which monitor the current flowing in the storage elements. These transients are then coupled back to the control circuits, which may lead to the upset of the control circuits, causing instability in the switching power supply.

Snubbers are one way of absorbing some of the excess energy while protecting the switching transistor from the transients. An exemplary snubber (205) is shown in FIG. 2 of the above-cited U.S. Pat. No. 4,499,532. The snubber 205, disposed across switching transistor S3, is a passive circuit relying on the diode D3 to bypass the resistor R20 when the transient has the desired polarity. However, it may absorb energy not considered to be in excess, making the switching power supply less efficient than desired. The energy dissipated by the snubber may exceed that which may be safely dissipated by an integrated circuit, making a monolithic switching power supply (except for the energy storage elements) unattainable.

SUMMARY OF THE INVENTION

It is therefore one aspect of the invention to provide a damper circuit for a switching power supply which adds stability to the switching power supply and has high efficiency.

It is another aspect of the invention to provide a damper circuit for a switching power supply which allows for the damper circuit to be integrated into the same integrated circuit with the control circuits thereof.

These and other aspects of the invention are provided for generally by a damper circuit for switching power supplies or the like, the supply having at least one transistor, driven by a control means, and an inductive energy storage element driven by the transistor, characterized by a resistor; and a switch, responsive to the input of the transistor, for coupling the resistor to the storage element when the transistor is substantially turned off.

These aspects are additionally provided for generally by a method for damping a power output stage in a switching power supply or the like, the power output stage having at least one transistor, driven by a control means, and an inductive energy storage element driven by the transistor, characterized by coupling a resistor to the storage element when the transistor is substantially turned off.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
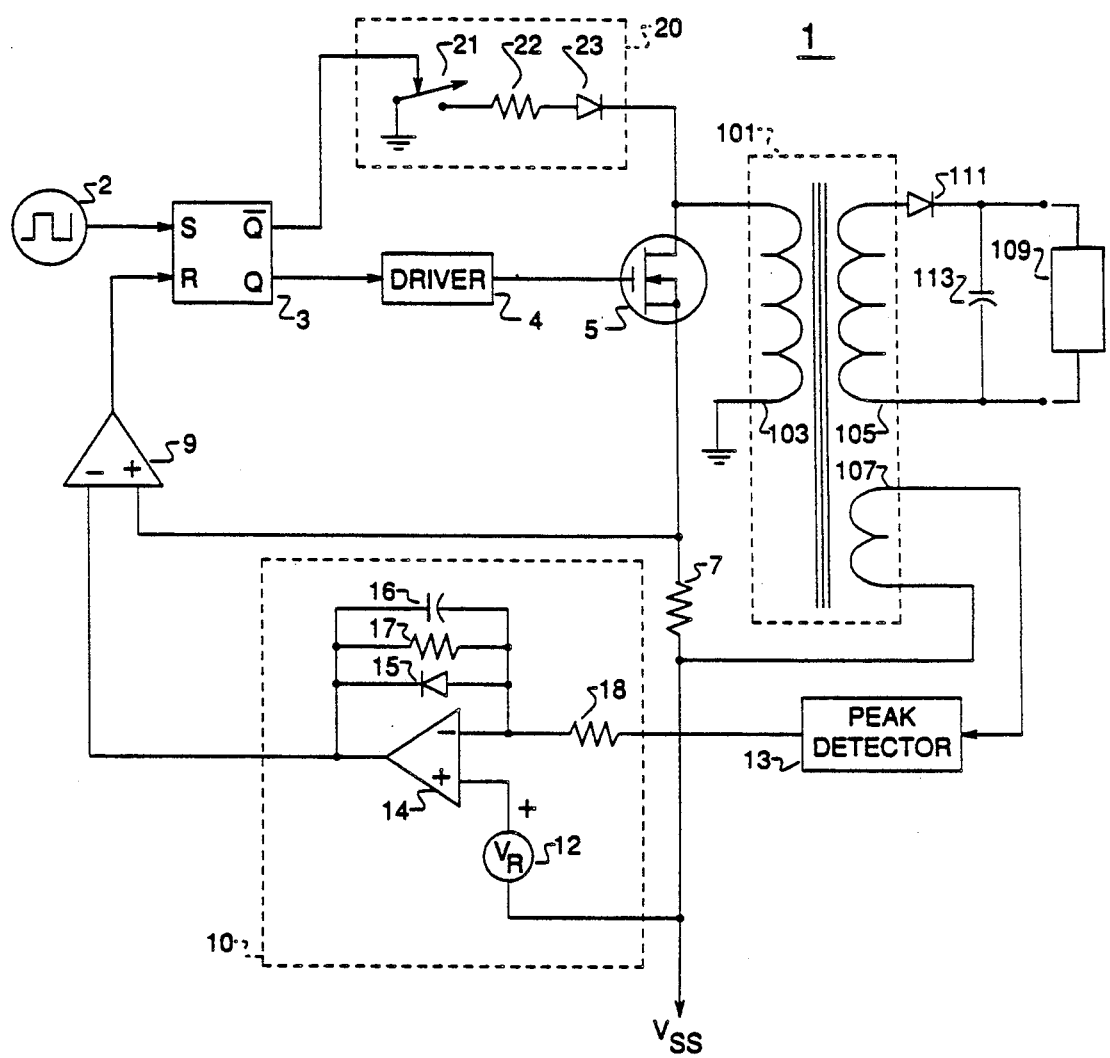
FIG. 1 is a schematic diagram of an exemplary switching power supply including a switched damper circuit in accordance of one embodiment of the invention.

In FIG. 1, an exemplary switching power supply 1 is shown. The supply 1 is similar to that discussed in the above-identified U.S. Pat. No. 4,704,670 and included herein by reference, except for the inclusion of a switched damper circuit 20. For purposes here, the operation of the exemplary supply will be discussed herein.

The switched power supply 1 has an inductive energy storage element, here transformer 101, being driven by switching transistor 5 to "inhale" energy from power source $V_{SS}$ and "exhale" the energy to the load 109. Transistor 5 is driven by control circuitry (2,3,4,9,10, and 13), which regulates the voltage and power delivered to the load 109. A switched damper circuit 20 is provided to absorb energy in the transformer 101 which was not transferred to the load 109 during the exhale. In accordance with one embodiment of the invention, the switched damper 20 includes a switch 21 which couples the resistor 22 to the transformer 101 when the transistor 5 is substantially off. Diode 23 assures that the resistor does not absorb energy which would normally by transferred to the load 109.

More specifically, the power supply 1 is a switched power supply driven by a clock source 2 having a substantially constant frequency. The clock source sets flip-flop 3, which in turn, via driver 4, turns on transistor 5, beginning the inhale portion of one switching cycle. Transistor 5 is shown here as a MOSFET, however it may be a bipolar transistor with a suitable driver 4. For purposes here, when transistor 5 is turned on, it is in saturation, meaning the transistor 5 acts substantially as a switch.

When transistor 5 turns on, current from voltage source $V_{SS}$, an exemplary −48 volts, flows through resistor 7, transistor 5, and into the primary winding 103 of transformer 101. Since primary winding 103 of transformer 101 is inductive, the current builds therein until the transistor 5 is turned off. The energy stored in the magnetic field (not shown) within transformer 101 is then transferred to secondary winding 105 and tertiary winding 107. Secondary winding 105 drives rectifier 111 and filter capacitor 113 to provide DC voltage to load 109.

Transistor 5 is turned off when flip-flop 3 is reset. Resetting flip-flop 3 occurs when the current flowing in the primary winding 103, while transistor 5 is turned on, exceeds an amount determined by the output voltage of the tertiary winding 107. The amount of current in the primary winding 103 is reflected in the voltage drop across resistor 7, here an exemplary 5.1Ω. Comparative 9 compares the voltage across resistor 7 to that provided by reference circuit 10. Details of the reference circuit 10 will be described below. When the current through winding 103 and, similarly, resistor 7 reach a certain amount, comparator 9 switches and resets flip-flop 3. This completes the inhale portion of one cycle in the switching cycle.

Reference circuit 10 provides an output voltage which is less than or substantially equal to the voltage ($V_R$) of voltage reference 12, such as a bandgap voltage reference, in response to the output of peak detector 13. When the voltage from peak detector 13 exceeds the voltage from reference 12, the output voltage from the operational amplifier 14 (which is the output of the reference circuit 10) decreases accordingly. Diode 15 and capacitor 16, in combination with the operational amplifier 14 and resistors 17 and 18, provide a precision rectifier function and a low-pass filter function, respectively. The capacitor 16 provides for stability and holds the output voltage between exhales.

The peak detector 13, driven by the tertiary winding 107, provides a voltage which corresponds to the voltage supplied to the load 109. Should the voltage from the output of peak detector 13, being proportionately scaled to the voltage across the load 109, exceed the reference voltage 12, the output of the reference circuit 10 decreases from $V_R$. This reduces the voltage at which the comparator 9 will switch, making the transistor 5 turn off sooner than it would if the voltage from detector 13 was less than $V_R$. This in effect limits the energy delivered to the load 109, such that a substantially constant voltage is applied across the load 109. When the voltage from detector 13 is less than $V_R$, the energy pumped into the transformer 101 is substantially constant since the current into the winding 103 is the same for each cycle since transistor 5 is turned-on for substantially the same amount of time each cycle.

Detailed operation of the switched damper 20 is described herein. The switched damper 20 is enabled by the inverted output ($\bar{Q}$) of flip-flop 3 such that the damper is disabled when the transistor 5 is turned-on. When switch 21 is closed, resistor 22 is disposed across the primary winding 103 by way of diode 23. Diode 23 assures that the resistor 22 is not absorbing energy which is to be delivered to the load 109 via secondary winding 105 and rectifier 111. The effect of the damper 20 is shown in FIG. 2.

Figure 2:
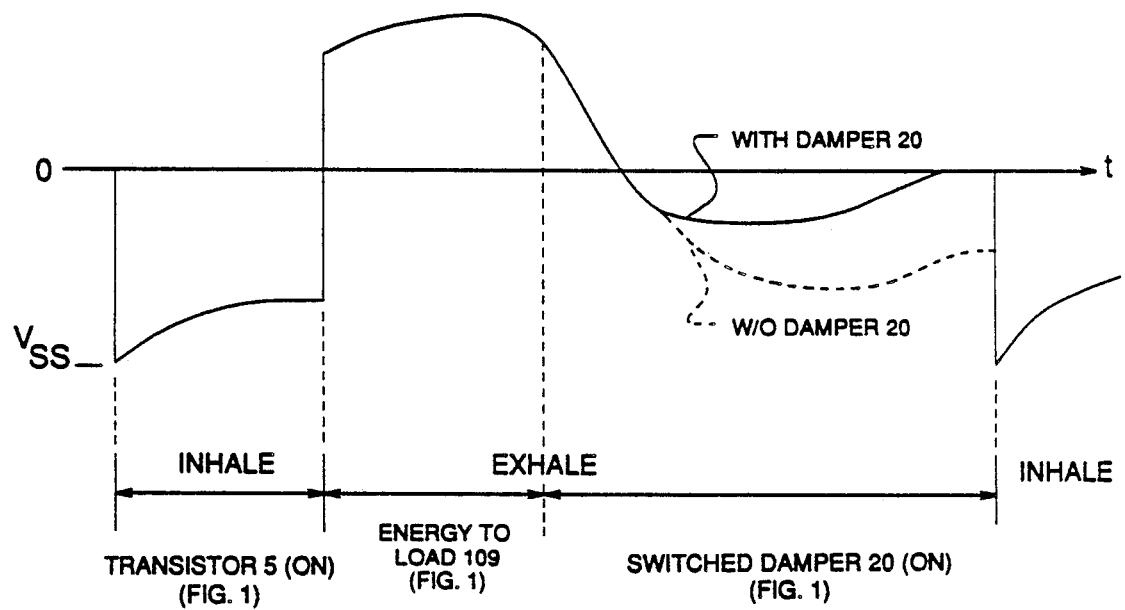
FIG. 2 is a plot of voltage across the primary of the transformer 101 shown in FIG. 1; and, FIG. 3 is a simplified schematic diagram of the switch portion of the switched damper circuit in accordance with another embodiment of the invention.

In FIG. 2, an approximated graph of the voltage across the primary winding 103 is shown for one exemplary switching cycle of the switched power supply 1 (FIG. 1). When transistor 5 (FIG. 1) is turned-on, the voltage across the winding 103 goes to approximately $V_{SS}$, and decays with current building up through the winding 103 as a result of an increasing voltage drop across resistor 7 (FIG. 1). When the current (actually, the voltage across resistor 7, as discussed above) reaches a certain amount set by reference circuit 10, the transistor 5 is turned off, causing the voltage to rapidly change polarity and beginning the exhale. At some voltage, the rectifier 111 (FIG. 1) conducts, allowing energy stored within the transformer 101 (FIG. 1) to pass to the load 109 (FIG. 1). Once the voltage across the secondary winding 105 (FIG. 1) decreases to the point that the rectifier 111 is no longer conducting, the voltage on the primary winding 103 decays, resembling a damped sinusoid and becoming negative again. The damped sinusoid results from the interaction of the inductance of the windings 103, 105, and 107 with stray capacitances (not shown) to form a resonant network. With damper 20 enabled, the voltage decreases to substantially zero before the next inhale. Without the damper 20, as shown by the dashed line, the voltage continues its damped sinusoid path, resulting in a nonzero voltage when the next inhale begins. As discussed above, when the voltage is not substantially zero, the switching power supply 1 may become unstable.

Both the minimum and maximum resistance of resistor 22 (FIG. 1) is that necessary for substantially absorbing all the excess energy just before the beginning of the next inhale, as shown in FIG. 2. It is preferable to have the resistance of resistor 22 be that which critically damps the primary winding 103 reactance for minimum discharge time. An exemplary value is 400Ω for a primary winding 103 inductance of 200 mH and a switching cycle frequency of 256 KHz. Resistor 22 may be integrated onto the same substrate as other circuitry for the switching supply 1 (FIG. 1).

Figure 3:
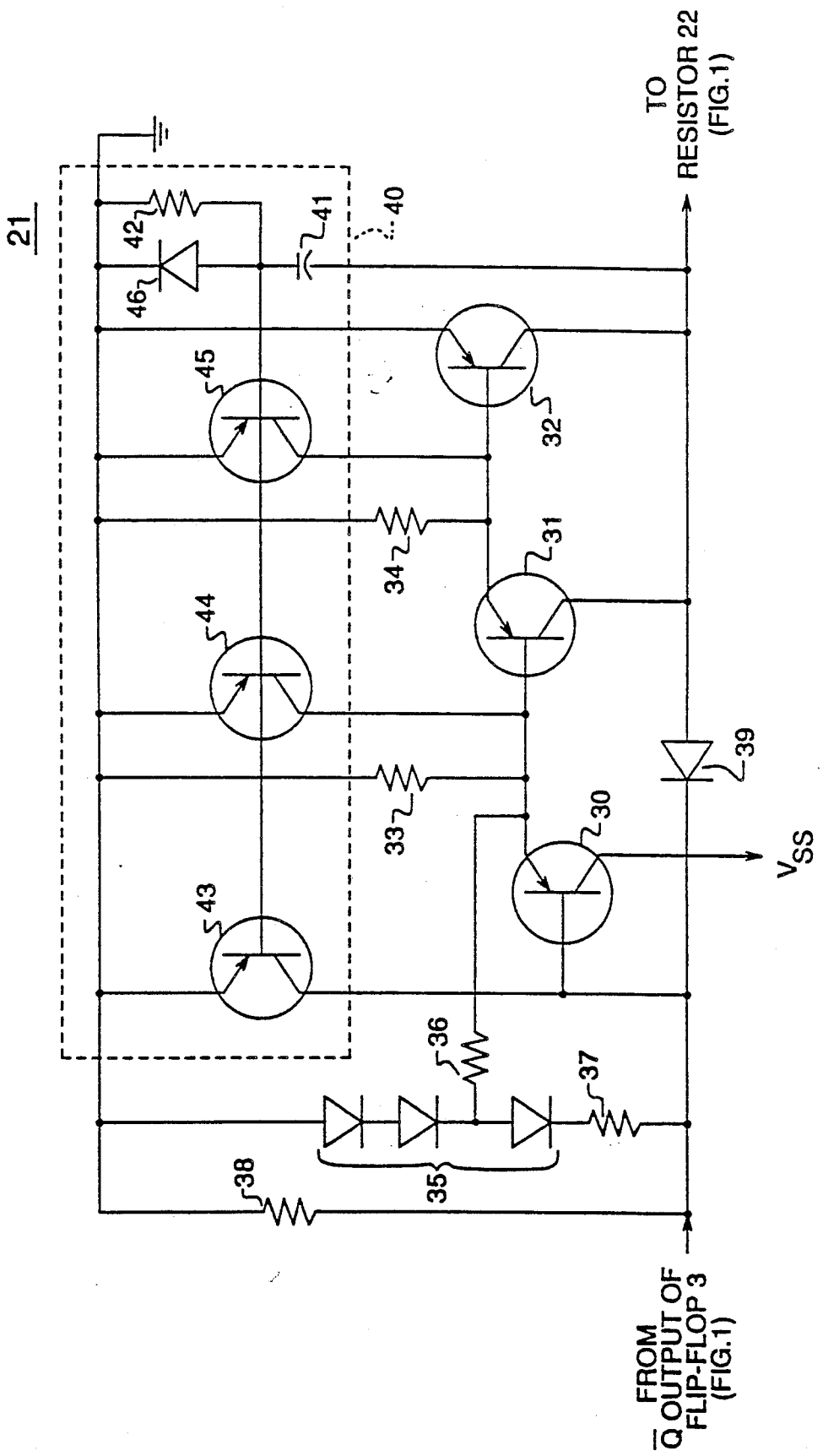

In FIG. 3, a simplified schematic of the switch 21 (FIG. 1) is shown, according to another embodiment of the invention. Transistors 30, 31, and 32, along with resistors 33 and 34 and bias circuit of 35–38, provide the actual switch function of switch 21. The transistors 30, 31, and 32 are arranged in a Darlington configuration, with the sizes of the transistors increasing accordingly. Exemplary sizes are 1×, 4× and 16× for transistors 30, 31, and 32, respectively. The resistors 33 and 34 serve to assure that transistors 31 and 32 are off when transistor 30 is off. The bias circuit of diode string 35 and resistors 36, 37 and pull-up resistor 38, along with anti-saturation diode 39, clamp the transistors 30, 31, and 32 so that they do not saturate, reducing the recovery time for the transistors 30, 31, and 32 when turned off. Further, the diode string 35 with resistors 36 and 37 limit the switch 21 to clamping, when on, to two diode forward voltage drops plus a small increment. This assures that carriers will not be injected into the integrated circuit substrate embodying the switch 21 (and what ever other circuitry, including the control circuitry if desired), which may lead to the destruction of the integrated circuit due to carrier injection induced latch-up.

When the $\overline{Q}$ output flip-flop 3 (FIG. 1) is activated, after the transistor 5 has been turned off, the base of transistor 30 is pulled low, thereby, in sequence, turning on transistors 30, 31, and 32. This couples resistor 22 (FIG. 1) to ground, most of the current flowing through transistor 32.

Also included in switch 21 is a clamp circuit 40 which disables the switch 21 when the change in voltage on the collectors of transistors 31 and 32 and the anode of diode 39 is fast enough to turn-on the transistors 30, 31, and 32. The undesired turn-on results from the collector-base capacitances of the transistors 31, 32 and the reversed-bias capacitance of diode 39 coupling a transient voltage of sufficient magnitude to the bases of transistors 31, 32 and 30, respectively, to turn them on. In particular and referring temporarily to FIG. 2, when transistor 5 (FIG. 1) turns on, the voltage across the primary winding 103 (FIG. 1) changes very quickly. Consequently, the voltage on the switch 21 also changes quickly, inadvertently turning on the switch 21, as discussed above. For example, the change in voltage (slew rate) when transistor 5 turns on may be about four volts per nanosecond. Clamp circuit 40 is designed to disable the switch 21 when the slew rate exceeds a predetermined amount, for example, one-half volt per nanosecond. But the clamp circuit 40 must not disable the switch 21 during the normal operation thereof when it is enabled to absorb the excess energy in the transformer 101 (FIG. 1), discussed above.

Clamp circuit 40 has a capacitor 41, connected to the collectors of transistors 31, 32 and diode 39, which couples the transient voltages thereon to the clamp circuit 40. The discrimination between the transients having excessive slew rates and those without is determined by the capacitor 41 in combination with resistor 42, forming an RC high-pass filter, or differentiator, network. When the transients have sufficient amplitude and slew rate to get through the filter of capacitor 41 and resistor 42 to turn on the transistors 43, 44, and 45, the switch 21 is disabled by the transistors 43, 44, and 45 shunting (clamping) the bases of corresponding transistors 30, 31, and 33 to ground. For the clamp circuit 40 to operate, the slew rate of the transient should exceed approximately $$\frac{V_{BE}}{RC},$$

where R is the resistance of resistor 42, C is the capacitance of capacitor 41, and $V_{BE}$ is the voltage required to turn on transistors 43, 44, and 45. Exemplary values for capacitor 41, resistor 42, and $V_{BE}$ is 4 pF, 10 kΩ, and 0.6 volts, respectively, for an approximately a fifteen volts per microsecond slew rate discrimination. Diode 46 protects transistors from reverse voltage transients breaking down and destroying the transistors 43, 44, and 45. The sizes of the transistors 43, 44 and 45 are scaled to enhance the clamping action; exemplary sizes are 6×, 4×, and 1×, respectively.

The embodiments shown in the figures and described here may be modified to use opposite conductivity devices and/or MOS transistors with suitable voltage and circuitry changes. The necessary changes are well known in the art and do not detract from the invention described and claimed here.

Although the embodiment shown in the figures and described here relates to a flyback type of switching power supply, the described techniques may apply to other types of switching power supplies, such as boost or buck types of switching supplies. These types of switching supplies also rely on the storage of energy in inductive energy storage elements, such as inductors, for their operation and may benefit from the invention described and claimed here.

It is preferable that the switching power supply 1 circuitry shown in FIGS. 1 and 3 be integrated into a common substrate, with the exception of the transformer 101 and other circuit components, such as transistor 5, which may not be convenient, practical, nor desirable to integrate. In particular, the rectifier 111 and filter capacitor 113 may need to be isolated from the remaining switching circuitry due to large voltage differences, etc., between circuit components.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. A method for damping a power output stage in a switching power supply or the like, the power output stage having at least one transistor, driven by a control means, and an inductive energy storage element driven by the transistor for providing a voltage across the storage element, characterized by:

coupling a resistor to the storage element when the transistor is substantially turned off; and disabling the switch when the voltage across the storage element changes faster than a predetermined rate.

2. A damper circuit for switching power supplies or the like, the supply having at least one transistor, driven by a control means, and an inductive energy storage element driven the the transistor to provide a voltage across the storage element, characterized by:

a resistor;

a diode disposed in service with the resistor;

a switch responsive to the input of the transistor, for coupling the resistor to the storage element when the transistor is substantially turned off; and clamping means, responsive to the control means, for disabling the switch when the voltage across the storage element changes faster than a predetermined amount.

3. The damper circuit as recited in claim 2, wherein the storage element is a transformer.

4. The damper circuit as recited in claim 2, wherein the control means, the resistor, and the switch are disposed in an integrated circuit.

* * * * *